United States Patent [19]
Roh et al.

[11] Patent Number: 5,790,464
[45] Date of Patent: Aug. 4, 1998

[54] METHOD FOR ARRANGING A MEMORY CELL ARRAY IN SEMICONDUCTOR MEMORY DEVICE

[75] Inventors: Jae-Gu Roh; Moon-Gone Kim, both of Suwon, Rep. of Korea

[73] Assignee: Samsung Electronics Co., Ltd., Suwon, Rep. of Korea

[21] Appl. No.: 580,213

[22] Filed: Dec. 28, 1995

[30] Foreign Application Priority Data

Dec. 29, 1994 [KR] Rep. of Korea ............ 1994-38500

[51] Int. Cl.⁶ .................................................. G11C 7/00
[52] U.S. Cl. ................................ 365/200; 365/230.06
[58] Field of Search ........................ 365/200, 230.06

[56] References Cited

U.S. PATENT DOCUMENTS 5,255,234  10/1993  Seok ........................................ 365/200
5,459,690  10/1995  Rieger et al. ........................... 365/200
5,617,364   4/1997  Hatakeyama ........................... 365/200

Primary Examiner—David C. Nelms
Assistant Examiner—Michael T. Tran
Attorney, Agent, or Firm—Jones & Volentine, L.L.P.

[57] ABSTRACT

A method of arranging a memory cell array in a semiconductor memory device, comprising the steps of dividing the memory cell array into a plurality of memory cell array areas having equal size, providing within the memory cell array a plurality of sub-normal memory cell arrays and at least one redundant memory cell array, arranging the plurality of sub-normal memory cell arrays and the at least one redundant memory cell array into the plurality of memory cell array areas, and arranging a plurality of sub-normal word line drivers, such that each sub-normal word line driver is adjacent to one of the plurality of memory cell array areas.

6 Claims, 3 Drawing Sheets

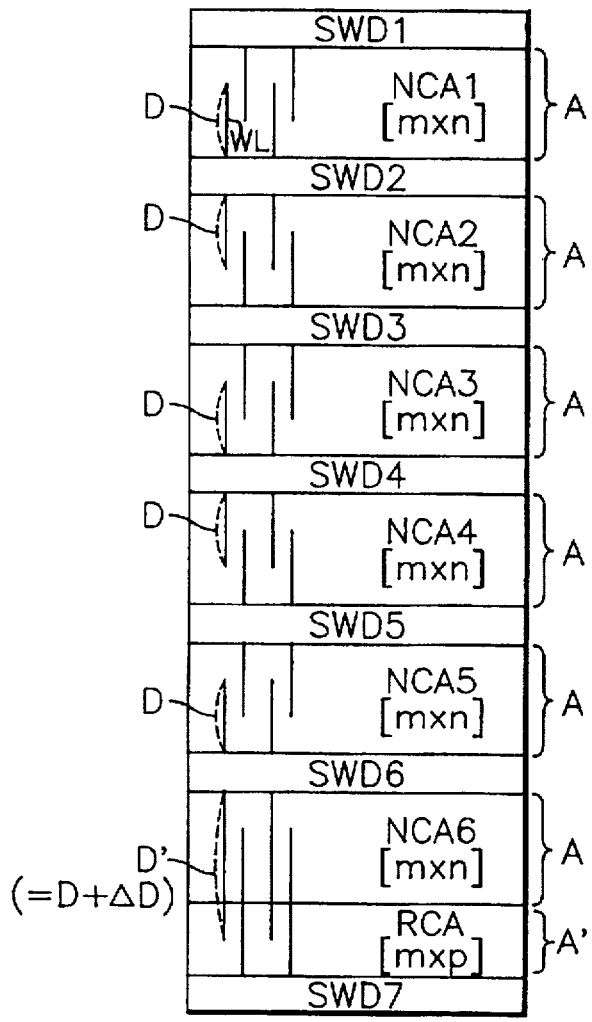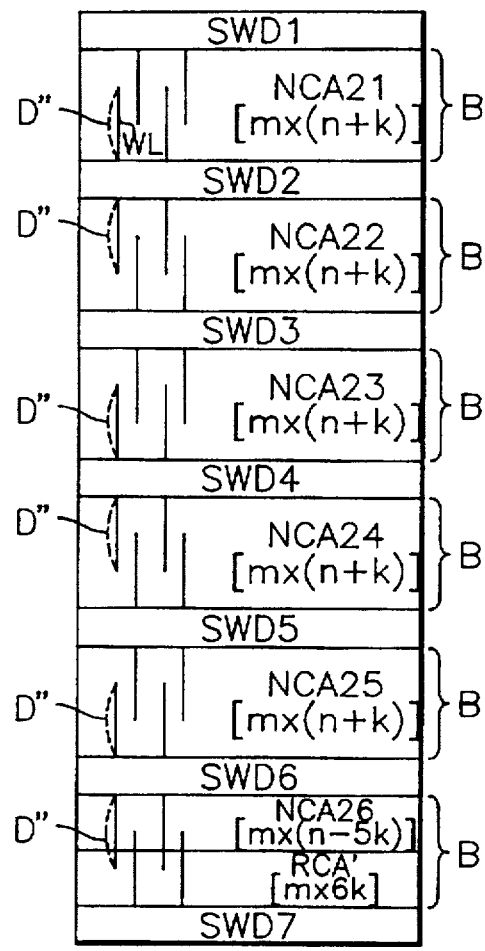
(PRIOR ART)
*FIG. 1*
*FIG. 2*

METHOD FOR ARRANGING A MEMORY CELL ARRAY IN SEMICONDUCTOR MEMORY DEVICE

BACKGROUND OF THE INVENTION

The present invention relates to a method for arranging a memory cell array in a semiconductor memory device. More particularly, the present invention relates to a method for arranging a memory cell array having divided word line drivers and redundant memory cell arrays.

In contemporary semiconductor memory devices, the memory cell array is generally divided into four memory banks, or memory mats, each of which is itself divided into a plurality of memory blocks. Each of the memory blocks is subsequently divided into a plurality of sub-memory cell arrays.

The highly integrated memory cell arrays in contemporary semiconductor memory devices have adopted a divided word line driver structure in which a plurality of word line drivers are provided, each word line driver being arranged between sub-memory cell arrays. This arrangement reduces word line delay in accordance with increments in the length of the word line. Each of the divided word line drivers selects word lines belonging to the word line group selected by a row decoder and, accordingly, connection between the row decoding lines selected by the row decoder and the word line drivers is accomplished.

In other words, as shown in FIG. 1, a single memory block comprises a plurality of sub-normal memory cell arrays NCA and redundant memory cell arrays RCA, in which a plurality of sub-word line drivers SWD are arranged between the sub-normal memory cell arrays NCA or at both sides thereof. Each of the sub-word line drivers SWD drives half of the word lines provided in the memory cell array adjacent thereto. In FIG. 1, the memory blocks are divided according to the strap number of the sub-normal memory cell arrays NCA or the number of the sub-word line drivers, and the redundant memory cell array RCA in which the redundant memory cells required in each of the sub-normal memory cell array NCA are arranged as a single array adjacent to any one, for example, NCA6, sub-normal memory cell array. If the sub-normal memory cell array NCA comprises m word lines and n column lines and if the redundant memory cell array RCA comprises m word lines and p column lines, then the larger number of column lines (n+p column lines) are arranged in an area (A'+A) including the sub-normal memory cell array NCA and the redundant memory cell array RCA. As a result, a length D of a word line WL' extending the area A' is longer by summation of the pitches of column lines than a length D of a word line WL extending the area A. Hence, the word line load of the redundant memory cell array RCA is relatively greater than that of the sub-normal memory cell arrays NCA, thereby causing a speed delay in redundancy operations.

SUMMARY OF THE INVENTION

The present invention provides a method for reducing word line delay in a redundant memory cell array. More particularly, the present invention provides a method for reducing word line delay in a semiconductor memory device having memory blocks divided into a plurality of arrays and having at least one redundant memory cell array.

In one aspect, the present invention accomplishes the foregoing in a method of arranging a memory cell array in a semiconductor memory device, comprising the steps of; dividing the memory cell array into a plurality of memory cell array areas having equal size, providing within the memory cell array a plurality of sub-normal memory cell arrays and at least one redundant memory cell array, arranging the plurality of sub-normal memory cell arrays and the at least one redundant memory cell array into the plurality of memory cell array areas, and arranging a plurality of sub-normal word line drivers, such that each sub-normal word line driver is adjacent to one of the plurality of memory cell array areas.

In another aspect, the present invention provides a method of arranging a memory cell array in a semiconductor memory device, comprising the steps of; dividing the memory cell array into a plurality of memory cell array areas having equal size, providing within the memory cell array a plurality of sub-normal memory cell arrays and a plurality of sub-redundant memory cell arrays, arranging the plurality of sub-normal memory cell arrays and the plurality of sub-redundant memory cell arrays in a one for one relationship into the plurality of memory cell array areas, and arranging a plurality of sub-normal word line drivers, such that each sub-normal word line driver is adjacent to one of the plurality of memory cell array areas.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements, wherein:

FIG. 1 is a block diagram illustrating a conventional memory cell array arrangement;

FIG. 2 is a block diagram illustrating a memory cell array arrangement according an embodiment of the present invention;

DETAILED DESCRIPTION OF THE PREFERRED EMBODIMENTS

Referring now to FIG. 2, even though a single memory cell array adjacent to a single sub-word line driver SWD is either in the area where only the sub-normal memory cell array exists or in the area where the sub-normal memory cell array and a redundant memory cell array are arranged, each single memory block is divided into a plurality of memory cell array areas B where the number of word lines is same as the number of column lines.

That is, sub-normal memory arrays NCA 21 through 26 and redundant memory cell array RCA' are arranged in a columnar fashion. Within this arrangement, redundant memory cell array RCA', having all the redundant memory cells required for each of the sub-normal memory cell arrays, is arranged with a sub-normal memory cell array NCA 26 between sub-word line drivers SWD.

When compared with the arrangement of FIG. 1 wherein conventional the sub-normal memory cell arrays includes n column lines , the sub-normal memory cell arrays NCA of FIG. 2 comprises m word lines and n+k column lines. Herein, the added number k of the column lines represents the number of the column lines of the redundant memory cell array RCA' divided into the sub-normal memory cell arrays NCA.

As each of the divided sub-normal memory cell arrays NCA 21 to NCA 25 has a [m×(n+k)] structure, the remaining sub-normal memory cell array NCA 26 has a [m×(n−5k)] structure, wherein 5k represents the number of column lines included within the sub-normal memory cell arrays NCA 21 to NCA 25. The redundant memory cell array RCA' included within the same memory cell array area B as sub-normal memory cell array NCA 26 has a (m×6k) structure, such that when the sub-normal memory cell array NCA 26 is added to the redundant memory cell array RCA' the resulting array is [m×(n+k)]. As a result, the memory block of FIG. 2 is consistently divided into memory cell array areas B having equal size. Accordingly, since the word lines which are drawn from a sub-word line driver SWD and run into the adjacent memory cell array area are arranged with an equal length D", word line delay for a specific memory cell, i.e., the memory cell including the redundant memory cell array, is avoided.

Selection of the column lines in each of the memory cell array areas B can be easily accomplished using conventional column decoding techniques.

Figure 3:
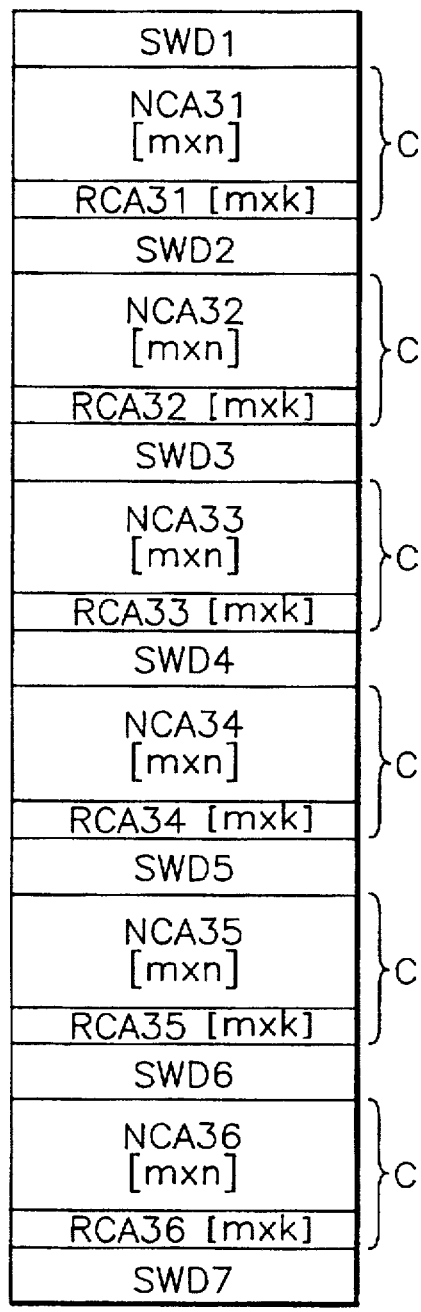
FIG. 3 is a diagram illustrating the memory cell array arranging state according to another embodiment of the present invention.

FIG. 3 is a diagram illustrating the memory cell array arranging state according to another embodiment of the present invention. In FIG. 3, the redundant memory cell array RCA' of FIG. 2 is divided into sub-redundant memory cell arrays RCA 31 to RCA 36 which are arranged in correspondence with a number of sub-normal memory cell arrays NCA 31 to 36. Each of the sub-normal memory cell arrays NCA has a [m×n] structure, whereas each of the sub-redundant memory cell arrays RCA has a [m×k] structure. In the same manner as FIG. 2, one memory block is evenly divided into memory cell array areas having equal size, and equal resulting word line lengths which prevent skewed word line delays between memory cell arrays.

Figure 4:
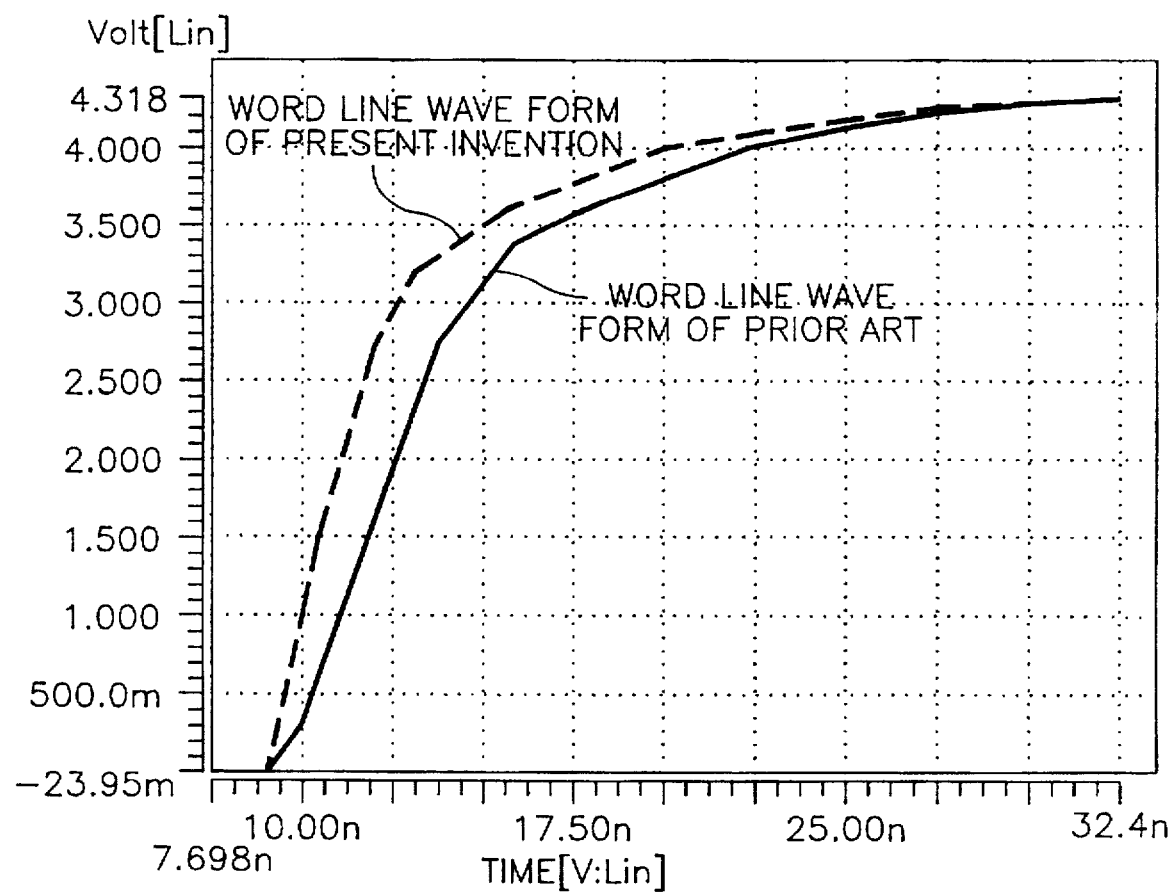
FIG. 4 is a graph illustrating a comparison of signal transmission states on word lines between the prior art and the present invention.

FIG. 4 is a graph illustrating a comparison of signal transmission performance through words lines configured according to the prior art and present invention, respectively. As seen in FIG. 4, the word line configuration of the present invention achieves a faster voltage rise over time as compared to the prior art word line configuration.

Excessive delay in but a single word line, that is delay in a word line associated with a memory array including the redundant memory cell array, ultimately causes delay in the overall processing speed of the highly integrated semiconductor memory. As described above, the method for arranging the memory cell arrays according to the present invention has the effect of improving operating speed in the semiconductor memory.

The foregoing embodiments have been given by way of example. The present invention is not limited to the disclosed embodiments, but is defined by the attached claims. Those of ordinary skill in the art will recognize modifications and alterations to the foregoing embodiments which fall within the scope the attached claims.

What is claimed is:

1. A method of arranging a memory cell array in a semiconductor memory device, comprising the steps of:

dividing the memory cell array into n memory cell array areas having equal size;

providing within the memory cell array n sub-normal memory cell arrays and at least one redundant memory cell array;

arranging the plurality of sub-normal memory cell arrays and the at least one redundant memory cell array into the plurality of memory cell array areas; and arranging (n+1) sub-normal word line drivers in an interleaved fashion with the n memory cell array areas, such that each sub-normal word line driver is adjacent to one or two of the n memory cell array areas, wherein n is an integer greater than or equal to 1, and wherein word line lengths for each of the n memory cell arrays are substantially the same.

2. The method of claim 1, wherein at least one of the n memory cell array areas comprises one of the n sub-normal memory cell arrays and at least one of the at least one redundant memory cell array.

3. A method of arranging a memory cell array in a semiconductor memory device, comprising the steps of:

dividing the memory cell array into a plurality of memory cell array areas having equal size:

providing within the memory cell array a plurality of sub-normal memory cell arrays and at least one redundant memory cell array;

arranging the plurality of sub-normal memory cell arrays and the at least one redundant memory cell array into the plurality of memory cell array areas; and arranging a plurality of sub-normal word line drivers, such that each sub-normal word line driver is adjacent to one of the plurality of memory cell array areas, wherein at least one of the plurality of sub-normal memory cell arrays has a first number of column lines less than a second number of column lines of other sub-normal memory cell arrays in the plurality of sub-normal memory cell arrays.

4. The method of claim 3, wherein the sum of the first number of column lines and a third number of column lines in the redundant memory cell array is equal to the second number of column lines.

5. The method of claim 1, wherein 2 of the (n+1) sub-normal word line drivers are arranged adjacent to one of the n memory cell array areas, and (n−1) sub-normal word line drivers are arranged adjacent to two of the n memory cell array areas.

6. A method of arranging a memory cell array in a semiconductor memory device, comprising the steps of:

dividing the memory cell array into a n memory cell array areas having equal size;

providing within the memory cell array n sub-normal memory cell arrays and n sub-redundant memory cell arrays;

arranging the n sub-normal memory cell arrays and the n sub-redundant memory cell arrays in a one for one relationship into the n memory cell array areas; and arranging (n+1) sub-normal word line drivers in an interleaved fashion with the n memory cell array areas, such that each sub-normal word line driver is adjacent to one or two of the n memory cell array areas, wherein n is an integer greater than or equal to 1, and wherein word line lengths for each of the n memory cell arrays are substantially the same.

* * * * *